United States Patent [19]
Laxman et al.

[11] Patent Number: 5,976,991
[45] Date of Patent: Nov. 2, 1999

[54] DEPOSITION OF SILICON DIOXIDE AND SILICON OXYNITRIDE USING BIS (TERTIARYBUTYLAMINO) SILANE

[75] Inventors: Ravi Kumar Laxman, Encinitas; David Allen Roberts, Escondido; Arthur Kenneth Hochberg, Solana Beach, all of Calif.

[73] Assignee: Air Products and Chemicals, Inc., Allentown, Pa.

[21] Appl. No.: 09/095,818

[22] Filed: Jun. 11, 1998

[51] Int. Cl.$^6$ .................................................. H01L 21/318
[52] U.S. Cl. ..................... 438/786; 438/790; 438/794; 427/99; 427/255.2
[58] Field of Search .................... 438/786, 787, 438/790, 791, 794

[56] References Cited

U.S. PATENT DOCUMENTS

| | | | |
|---|---|---|---|
| 5,234,869 | 8/1993 | Mikata et al. | 438/793 |
| 5,874,368 | 2/1999 | Laxman et al. | 438/794 |

FOREIGN PATENT DOCUMENTS

| | | | |
|---|---|---|---|
| 6132284 | 5/1994 | Japan | H01L 21/318 |

OTHER PUBLICATIONS

Silicon Processing for the VLSI ERA, Wolf, Stanley, and Talbert, Richard N., Lattice Press, Sunset Beach, California (1990), pp. 20–22, 327–330.

Inorganics & Organometallics from Aldrich, 1998–99.

A. K. Hochberg and D.L. O'Meara, Mat. Res. Soc. Symp. Proc., vol. 204, (1991), pp. 509–514.

R. G. Gordon and D. M. Hoffman, Chem. Mater., vol. 2, (1990), pp. 482–484.

Sorita et al., J. Electro. Chem. Soc., vol. 141, No. 12, (1994), pp. 3505–3511.

B. A. Scott, J. M. Martinez–Duart, D. B. Beach, T. N. Nguyen, R. D. Estes and R. G. Schad., Chemtronics, 1989, vol. 4, pp. 230–234.

J. M. Grow, R. A. Levy, X. Fan and Bhaskaran, Materials Letters, 23, (1995), pp. 187–193.

*Primary Examiner*—Olik Chaudhuri
*Assistant Examiner*—Anh Duy Mai
*Attorney, Agent, or Firm*—Geoffrey L. Chase

[57] ABSTRACT

A process for the chemical vapor deposition of silicon dioxide and silicon oxynitride from reactant gases $O_2$, $O_3$, $N_2O$, NO, $NO_2$, $NH_3$ and a silane of the formula: $(t-C_4H_9NH)_2SiH_2$. A process whereby a stack of silicon containing dielectrics ranging from silicon nitride to silicon oxide may be deposited successively (at the same pressure and temperature) by changing the reactants $O_2$, $O_3$, $N_2O$, NO, $NO_2$, $NH_3$ while maintaing a constant flow of $(t-C_4H_9NH)_2SiH_2$. The films are suitable for use in the semiconductor and related industries.

9 Claims, 3 Drawing Sheets

DEPOSITION OF SILICON DIOXIDE AND SILICON OXYNITRIDE USING BIS (TERTIARYBUTYLAMINO) SILANE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The present invention is directed to the field of chemical vapor deposition of silicon dioxide and silicon oxynitride films using bis(tertiarybutylamino)silane, a novel organosilicon source material. It allows for the deposition of different dielectrics using the same organosilicon source, temperature, and pressure simply by varying reactant gases.

In the fabrication of semiconductor devices, a thin passive layer of a chemically inert dielectric material such as, silicon dioxide, silicon oxynitride and silicon nitride films, is essential. Thin layers of these dielectric films function as diffusion masks, oxidation barriers, trench isolation, intermetallic dielectric material with high dielectric breakdown voltages and as passivation layers.

The present semiconductor industry standard for silicon dioxide and silicon oxynitride growth methods is by low pressure chemical vapor deposition in a hot wall reactor at >400° C.

Deposition of silicon dioxide over large numbers of silicon wafers has been accomplished using silane and oxygen above 400° C., by dichlorosilane and $N_2O$ above 800° C., and by tetraethoxysilane above 650° C. Deposition of silicon oxynitride has been obtained using dichlorosilane, $N_2O$, and $NH_3$ above 750° C., see Semiconductor and Process technology handbook, edited by Gary E. McGuire, Noyes Publication, New Jersey, (1988), pp 289–301; and Silicon Processing for the VLSI ERA, Wolf, Stanley, and Talbert, Richard N., Lattice Press, Sunset Beach, Calif. (1990), pp 20–22, 327–330.

Higher deposition temperatures are typically employed to get the best film properties. There are several drawbacks in these processes, and some of these are as follows:
i) Silane and dichlorosilane are pyrophoric, toxic compressed gases; ii) Oxide depositions with dichlorosilane require very high temperatures and have very low deposition rates. The films may contain chlorine and there is a significant particle contamination problem. iii) Films formed using silane are not dense and are hygroscopic. This process requires expensive "caged boats" to obtain usable deposited film uniformities. Small deviations in oxygen to silane ratios may produce homogeneous reactions that will produce significant particle contamination.

A. K. Hochberg and D. L. O'Meara, Mat. Res. Soc. Symp. Proc,. Vol. 204, (1991), pp 509–514, report deposition of silicon nitride and silicon oxynitride by using diethylsilane with ammonia and nitric oxide by LPCVD. The deposition was carried out in the temperature range of 650° C. to 700° C. Usable deposition rates are obtained at temperatures above 650° C. and the deposition rate drops to below 4 Å/min at lower temperatures. In the LPCVD process, precursors which contain direct Si—C carbon bonds result in carbon contamination in the films. Carbon free deposition requires greater than 5:1 $NH_3$ to precursor ratios. At lower ammonia concentrations, the films were found to contain carbon. Diethylsilane+ammonia processes typically require covered boats to improve wafer uniformities.

Japanese Patent 6-132284 describes deposition of silicon nitride using organosilanes with a general formula $(R_1R_2N)_nSiH_{4-n}$ (where $R_1$ and $R_2$ range from H—, $CH_3$—, $C_2H_5$— $C_3H_7$—, $C_4H_9$—) by a plasma enhanced chemical vapor deposition and thermal chemical vapor deposition in the presence of ammonia or nitrogen. The precursors described here are tertiary amines and do not contain NH bonding as in the case of the present invention. The deposition experiments were carried out in a single wafer reactor at 400° C. at high pressures of 80–100 Torr. The Si:N ratios in these films were 0.9 (Si:N ratios in $Si_3N_4$ films is 0.75) with hydrogen content in the deposited films. The butyl radical is in the form of isobutyl.

U.S. patent application Ser. No. 08/942,996 filed Oct. 2, 1997 discloses a process for the low pressure chemical vapor deposition of silicon nitride on a substrate using ammonia and a silane of the formula: $(t-C_4H_9NH)_2SiH_2$.

U.S. Pat. No. 5,234,869 and R. G. Gordon and D. M. Hoffman, Chem. Mater., Vol. 2, (1990), pp 482–484 disclose other attempts to reduce the amount of carbon involved aminosilanes, such as tetrakis(dimethylamino)silane. The temperature of deposition is in the range of 300–1000° C. with pressures in the range of 1 mTorr–10 Torr. The presence of direct Si—N bonds and the absence of Si—C bonds were expected to give lower carbon concentrations in the films. Howeve, there are three main disadvantages with precursors of this class.

1) They contain N-methyl groups, the methyl groups tend to migrate to the silicon surface readily and contaminate the films with carbon during a CVD process. In order to reduce the amount of carbon, the process involves high temperatures (>700) and high ammonia ratios (>10:1). With increased ammonia ratios the deposition rates dramatically reduce due to reactant depletion.

2) They do not contain NH bonding and they do not involve secondary silanes.

3) At lower temperatures the deposition rates and uniformities are very poor (>5%).

The prior art has attempted to produce silicon dioxide or silicon oxynitride or silicon nitride films at temperatures >550° C., at high deposition rates and low hydrogen and carbon contamination. However, the prior art has not been successful in achieving all these goals simultaneously with one silicon precursor. The present invention has overcome the problems of the prior art with the use of a single precursor for the formation of silicon dioxide and silicon oxynitride (as well as silicon nitride), which avoids the problems of plasma deposition, operates at low thermal conditions (<600° C.), avoids Si—C bonds to reduce carbon contamination of the resulting films, has low hydrogen contamination, as well as avoiding chlorine contamination and operates at low pressures (20 mTorr–2 Torr) and up to atmospheric pressures in a manufacturable batch furnace (100 wafers or more) or a single wafer reactor, as will be described in greater detail below.

BRIEF SUMMARY OF THE INVENTION

The present invention is a process for the deposition on a substrate of a film of an oxygen containing silicon compound selected from the group consisting of silicon dioxide and silicon oxynitride by reacting bis(tertiarybutylamino) silane at an elevated temperature with a reactant gas selected from the group consisting of oxygen, ozone or mixtures thereof when the silicon compound is silicon dioxide or selected from the group consisting of a nitrogen oxide, ammonia and mixtures thereof when the silicon compound is silicon oxynitride.

To form silicon dioxide films, the bis(tertiarybutylamino) silane and $O_2$ or $O_3$ are allowed to react in the reactor tube at an elevated temperature, preferably 500° C.–800° C. To form silicon oxynitride films, the bis(tertiarybutylamino) silane and $N_2O$, $NO_2$ or NO with or without $NH_3$ are allowed to react in the reactor tube at an elevated temperature, preferably 500° C.–800° C. The composition of the film to obtain desired ON ratios can be easily accomplished by changing the ratios of the reactant gas mixtures as described in the experimental section.

Preferably, the pressure is in the range of approximately 20 mTorr to 1 atmosphere.

Preferably, the molar ratio of reactant gases $O_2$, $O_3$, $N_2O$, NO, $NO_2$, $NH_3$ or mixtures of gases to BTBAS is greater than approximately 1:1.

Preferably, the substrate is silicon.

Preferably, the substrate is an electronic device.

Alternatively, the substrate is a flat panel display.

In a preferred embodiment, the present invention is a chemical vapor deposition of silicon dioxide in a reaction zone, comprising the steps of:
 a) heating a substrate to a temperature in the range of approximately 500–800° C. in the zone;
 b) maintaining the substrate at a pressure in the range of approximately 20 mTorr–1 atmosphere in the zone;
 c) introducing into the zone a reactant gas of $O_2$ and a silane of the formula: $(t-C_4H_9NH)_2SiH_2$ and reacting the reactant gas with the silane; and
 d) maintaining the conditions of a) through c) sufficient to cause a film of silicon dioxide to deposit on the substrate.

In an alternative embodiment, the present invention is a chemical vapor deposition of silicon oxynitride in a reaction zone, comprising the steps of:
 a) heating a substrate to a temperature in the range of approximately 500–800° C. in the zone;
 b) maintaining the substrate at a pressure in the range of approximately 20 mTorr–1 atmosphere in the zone;
 c) introducing into the zone reactant gases selected from the group consisting of $N_2O$, NO, $NO_2$, and mixtures thereof, ammonia and a silane of the formula: $(t-C_4H_9NH)_2SiH_2$ and reacting the reactant gases with the silane; and
 d) maintaining the conditions of a) through c) sufficient to cause a film of silicon oxynitride to deposit on the substrate.

In a further alternative embodiment, the present invention is a process for the chemical vapor deposition on a substrate of a stack of silicon compounds selected from the group consisting of silicon dioxide, silicon oxynitrides and silicon nitride in a reaction zone, comprising the steps of:
 a) heating the substrate to a temperature in the range of approximately 500–800° C. in the zone;
 b) maintaining the substrate at a pressure in the range of approximately 20 mTorr–1 atmosphere in the zone;
 c) introducing into the zone a silane of the formula: $(t-C_4H_9NH)_2SiH_2$;
 d) introducing into the zone varying amounts of a reactant gas selected from the group consisting of $O_2$, $O_3$, $N_2O$, NO, $NO_2$, $NH_3$ and mixtures thereof appropriate to deposit multiple stacked layers of a film of a silicon compound containing silicon and one or more of oxygen, nitrogen and mixtures thereof, wherein each stacked layer can have a different amount of oxygen, nitrogen and mixtures thereof and reacting the reactant gas with the silane;
 e) maintaining the conditions of a) through c) sufficient to cause the multiple stacked layers of a film of the silicon compound to deposit on the substrate.

DETAILED DESCRIPTION OF THE INVENTION

Figure 1:
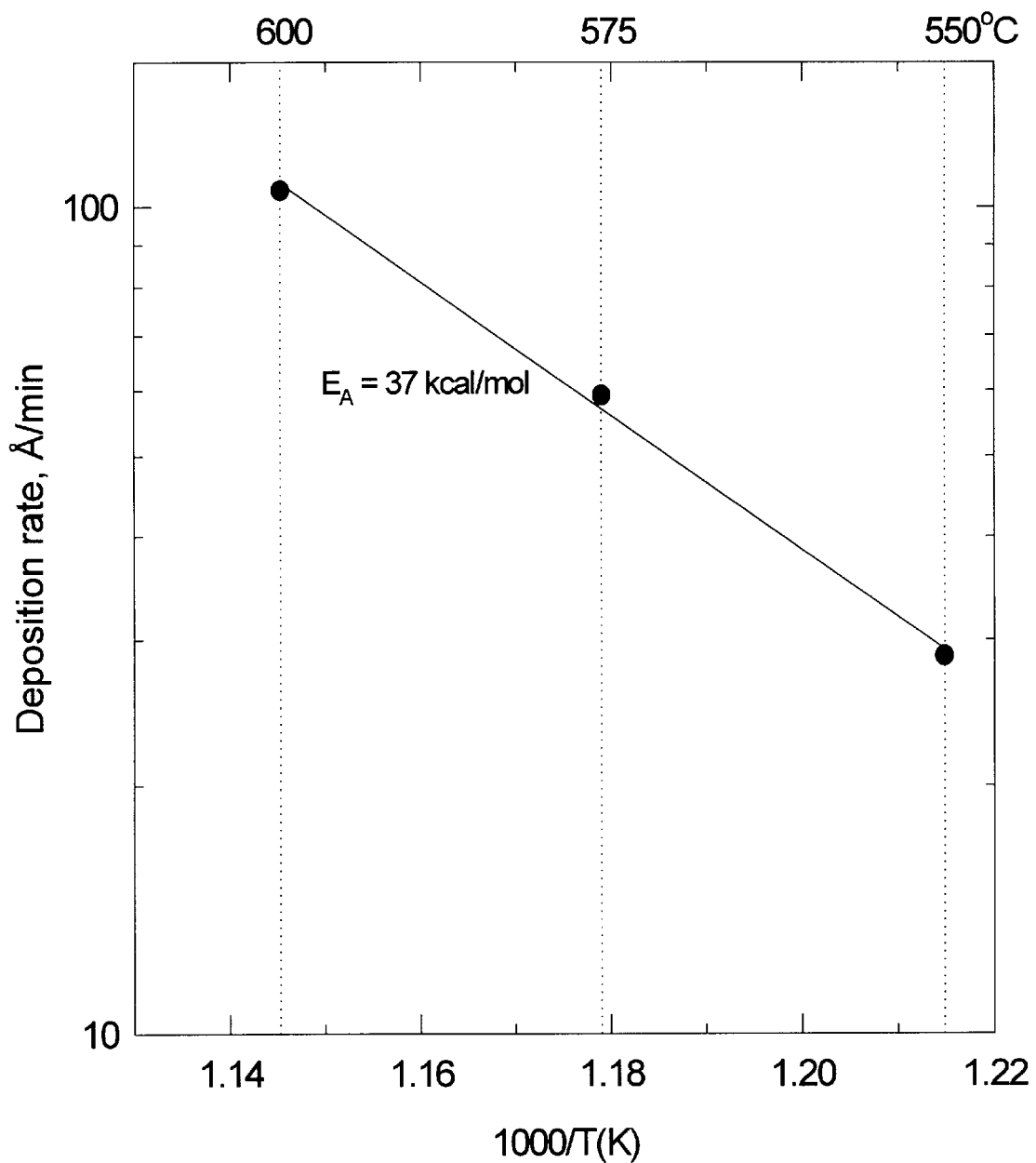
FIG. 1 is a graph of the temperature dependence of the deposition rate of silicon oxide using bis(t-butylamino) silane and oxygen.

A large variety of "thin films" are used in the fabrication of Very Large Scale Integration (VLSI) devices. These deposited thin films can be of metals, semiconductors, or insulators. The films may be thermally grown or deposited from the vapor phase using low pressure chemical vapor deposition (LPCVD). VLSI technology requires very thin insulators for a variety of applications in both microprocessors and random-access memories device fabrication. Silicon dioxide has been predominantly used as a dielectric material because of its ease of deposition and excellent properties at the $SiO_2/Si$ interface. Silicon nitride has other advantages over silicon dioxide, some of these include impurity and dopant resistant diffusion barriers, high dielectric breakdown voltages, superior mechanical and inherent inertness of $Si_3N_4$. Charge transport in metal nitride oxide and semiconductor (MNOS) devices can be reduced by depositing a thin layer of silicon oxynitride prior to silicon nitride deposition or by replacing silicon nitride with silicon oxynitride.

In VLSI fabrication a large set of rigorous chemical, structural, process and electrical requirements need to be satisfied. Purity of the film, thickness, uniformity and deposition rates are some of the strictly controlled parameters to facilitate fabrication of submicron features in a device. It is a major advantage in the fabrication and performance of a device if the deposition process can be carried out at temperatures lower than 850° C. There is no report of a silicon source material for depositing a stack of dielectrics of varying oxygen and nitrogen concentrations at the same temperature below 600° C. with usable film uniformities over large wafer surfaces and large wafer batches. A safe, reliable low temperature dielectric source material has applications in other technologies, such as; flat panel display devices, other electronic and non-electronic substrates or compound semiconductor device fabrication.

The present invention is directed to bis (tertiarybutylamino)silanes as a class of aminosilanes that deposit silicon dioxide and silicon oxynitride at the same unexpectedly low temperatures with superior uniformities.

The bis(tertiarybutylamino)silane (BTBAS) has the following formula:

The deposited films have superior uniformities and are free of ammonium chloride and chlorine contamination. Analogous aminosilanes which contain ligands, such as n-butylamines and tetrakis(dimethylamino)silane, do not deposit carbon free films at such low temperatures by LPCVD or otherwise, and the film uniformities are poorer.

The remarkable advantages of bis(tertiarybutylamino) silane may be attributable to the inherent property of t-butyl amine ligands in bis(tertiarybutylamino)silane. During pyrolysis of bis(tertiarybutylamino)silane, the t-butyl amine ligand may eliminate readily as isobutylene. Isobutylene is a very stable, good leaving group and thus does not contaminate films during deposition. In comparison to the dialkylaminosilanes, tertiarybutylamino groups are more basic than dialkylamines due to the presence of the nitrogen-hydrogen bond (N—H) in the tertiarybutylamino group. The presence of the N—H bond may facilitate labile β-hydride transfer to form diaminosilane and cleavage of the tertiary-butyl group as isobutylene.

Other advantages of bis(tertiarybutylamino)silane can be summarized as follows:

1) It is a non-pyrophoric volatile stable liquid with a vapor pressure of 7.5 Torr at 40–45° C.

2) It does not have any chlorine in the precursor. The Si—Cl bonds in dichlorosilane leads to the formation of ammonium chloride during the deposition of silicon nitride which deposits in the back end of the tube and requires frequent cleaning.

3) The precursor does not contain direct Si—C bonds, and the resulting silicon oxide and silicon oxynitride films have very low carbon content.

4) The t-butyl amino ligands behave as good leaving groups to form isobutylene and are readily eliminated during pyrolysis. This is thought to be in part because the compound has a N—H bond. This additional advantage helps in removing all the carbon cleanly without contaminating the deposited films.

5) The steric bulk in BTBAS helps in increased mobility of the molecules on the surface of the substrate which results in higher uniformity.

The bis(tertiarybutylamino)silane compound is also more desirable than than the mono, tri or tetrakis (tertiarybutylamino) analog because the mono analog is unstable, the tri substituted analog has significant delivery problems, the tetrakis (tertiary butylamino)silane analog has much lower vapor pressure and cannot be readily synthesized due to steric bulk of the ligands on a single silicon atom and therefore, inappropriate for commercial use. The N—H bonding properties discussed above is an added advantage in the case of when compared to other alkylaminosilane.

To form silicon dioxide films, the bis(tertiarybutylamino) silane and $O_2$, $O_3$ or mixtures are allowed to react in the reactor tube at an elevated temperature, preferably 500° C.–800° C. To form silicon oxynitride films, the bis (tertiarybutylamino)silane and $N_2O$, $NO_2$ or NO plus $NH_3$ are allowed to react in the reactor tube at an elevated temperature, preferably 500° C.–800° C. The O/N ratio in the silicon oxynitride can be varied by changing the ratios of reactant gases as desired. Surprisingly, silicon dioxide is not formed by adding NO or $N_2O$ to BTBAS at these low temperatures, in contrast to oxide formation using dichlorosilane and $N_2O$.

Stacked layers of a film of a silicon compound, wherein each layer has a potentially discrete concentration of oxygen and nitrogen varying layer to layer from all silicon and oxygen in the form of silicon dioxide for a particular layer or layers, through various concentrations of silicon, oxygen and nitrogen in the form of silicon oxynitride for a particular layer or layers, to silicon and nitrogen in the form of silicon nitride for a particular layer or layers, can be deposited merely by varying the concentration of the reactant gases of $O_2$, $O_3$, $N_2O$, NO, $NO_2$, $NH_3$ and mixtures that react with the BTBAS for each layer in the stack which comprises the ultimately deposited film.

The CVD process can be grouped into a) a gas-phase process and b) a surface reaction process. The gas phase phenomenon is the rate at which gases impinge on the substrate. This is modeled by the rate at which gases cross the boundary layer that separates the bulk regions of flowing gas and substrate surface. Such transport processes occur by gas-phase diffusion, which is proportional to the diffusivity of the gas and concentration gradient across the boundary layer. Several surface processes can be important when the gases reach the hot surface, but the surface reaction, in general, can be modeled by a thermally activated phenomenon which proceeds at a rate which is a function of the frequency factor, the activation energy, and the temperature.

Reaction may occur either on the surface or very close to the wafer surface to deposit a thin film of silicon dioxide or silicon oxynitride, as required. If the reaction occurs in the gas phase (a homogeneous reaction) then clusters of silicon dioxide or silicon oxynitride are formed. When the reaction occurs close to the wafer surface then the resulting films are of superior uniformities. Thus, one important requirement for CVD application is the degree to which heterogeneous reactions are favored over gas phase reactions.

The surface reaction rate increases with increasing temperature. For a given surface reaction, the temperature may rise high enough so that the reaction rate exceeds the rate at which reactant species arrive at the surface. In such cases, the reaction cannot proceed any more rapidly than the rate at which reactant gases are supplied to the substrate by mass transport. This is referred to as a mass-transport limited deposition process. At lower temperatures, the surface reaction rate is reduced, and eventually the concentration of reactants exceeds the rate at which they are consumed by the surface reaction process. Under such conditions the deposition rate is reaction rate limited. Thus, at high temperatures, the deposition is usually mass-transport limited, while at lower temperatures it is surface-reaction rate-limited. In actual processes, the temperature at which the deposition condition moves from one of these growth regimes to the other is dependent on the activation energy of the reaction, and the gas flow conditions in the reactor. Thus, it is difficult to extrapolate process conditions or results from one pressure regime or temperature regime to another.

In processes that are run under reaction rate-limited conditions, the temperature of the process is an important parameter. That is, uniform deposition rates throughout a reactor require conditions that maintain a constant reaction rate. This, in turn, implies that a constant temperature must exist everywhere on all wafer surfaces. On the other hand, under such conditions, the rate at which reactants reach the surface is not important, since their concentration does not limit the growth rate. Thus, it is not as critical that a reactor be designed to supply an equal flux of reactants to all locations of a wafer surface. It should be appreciated that in LPCVD reactors, wafers can be stacked vertically and at very close spacing because such systems operate in a reaction rate limited mode. The reason for this is as follows: Under the low pressure of an LPCVD reactor ~1 torr, the diffusivity of the gas species is increased by a factor of 1000 over that at atmospheric pressure, and this is only partially offset by the fact that the boundary layer, the distance across which the reactants must diffuse, increases by less than the square root of the pressure. The net effect is that there is more than an order of magnitude increase in the transport of reactants to and byproducts away from the substrate surface, and the rate-limiting step is thus the surface reaction.

The presence of the tertiary-butyl group in bis(tertiarybutylamino)silane apparently helps the surface reaction pathways and hence the deposited films have a superior uniformity when compared to other processes, even at lower temperatures. These films were deposited using an LPCVD hot walled reactor, as described below.

Low pressure chemical vapor deposition processes (LPCVD) involve chemical reactions that are allowed to take place in the pressure range of 20 mTorr to 2 Torr. The chemical vapor deposition (CVD) process can be described in the following sequence of steps at a given temperature, pressure and ratio of the reactants:

1) Reactants are introduced into the reaction chamber and may be diluted with inert gases, if needed;
2) The reactants are allowed to diffuse to the substrate;
3) The reactants are adsorbed on the substrate, and the adsorbed molecules undergo migration; and
4) Chemical reactions occur on the surface, and the gaseous byproducts of the reaction are desorbed, leaving behind the deposited film. The reactions are initiated by several methods; e.g., thermal or photons. Thermal energy is used in the LPCVD process.

Horizontal tube hot wall reactors are the most widely used for LPCVD in VLSI manufacturing. They are employed for depositing poly-Si, silicon nitride and undoped and doped silicon dioxide films. These reactors are used extensively because they are economical, have high throughputs, their deposited films are uniform and they can accommodate large diameter wafers (6"–12"). Their main disadvantages are poor thermal uniformity over wafers greater than 150 mm diameter and difficulties in automation.

The vertical flow isothermal LPCVD reactor may also be used for deposition of silicon dioxide. These reactors are more easily automated than horizontal reactors and produce more uniform temperatures across large diameter wafers.

To induce the low pressure conditions in the reactor, an appropriate vacuum system is necessary. For the present experiments, the vacuum system consisted of a rotary vane pump/roots blower combination and various cold traps. The reactor pressure is controlled by a capacitance manometer feedback to a throttle valve controller. Reactor loading consisted of eighty 100 mm diameter silicon wafers at 9 mm spacing in standard diffusion boats. The boats were positioned on a sled, so that the wafers centers were slightly above the center of the reaction tube. This produces a uniform conductance around the wafer peripheries by compensating for conductance restrictions caused by the boats and the sled. The temperature uniformity across the wafer load for the data presented was ±1° C. as measured by an internal multi-junction thermocouple. Deposition uniformity down the wafer load is improved by a temperature ramp.

Our deposition experiments were carried out in a horizontal tube reactor, but the deposition with this precursor will occur even in a vertical tube reactor. The precursor was fed through an open port near the load door. Reactant gases $O_2$, or $O_3$ for silicon dioxide or $N_2O$, NO or $NO_2$ and $NH_3$ for silicon oxynitride were also fed from a port near the door of the furnace independently.

The present invention of a method of depositing substantially pure thin silicon dioxide and silicon oxynitride, films on silicon wafers by using a bis(tertiarybutylamino)silane precursor has been demonstrated experimentally. The bis(tertiarybutylamino)silane is a non-pyrophoric volatile liquid which is safer to handle than silane and dichlorosilane. The deposition process is carried out at low to atmospheric pressure, preferably 20 mTorr–2 Torr and at elevated temperature preferably in the temperature range of preferably 500° C. to 800° C. using vapors from bis(tertiarybutylamino)silane and reactant gases $O_2$ or $O_3$ for silicon dioxide or $N_2O$, NO or $NO_2$ and $NH_3$ for silicon oxynitride. Optionally, an inert gas diluent, such as nitrogen or argon, can be used to dilute and control the rate of reaction. The molar feed ratio of reactant gases as mentioned above, to bis(tertiarybutylamino)silane and is preferably greater than 1:1.

EXAMPLE 1

The process involves reaction of bis(tertiarybutylamino)silane with oxygen at 250 mTorr reactor pressure. The precursor and oxygen are introduced into the heated reactor (550–625° C.)—at the door. The reactants are flowed over wafers into the evacuated chamber. The oxygen to silicon source is kept at a ratio in the range of 1.6:1–2:1. A continuous film of silicon dioxide is deposited upon the surface of a silicon wafer. These films are suitable for integrated circuit manufacture. A typical run was carried out in a 150 mm hot wall LPCVD horizontal tube reactor, although the apparatus configuration is not critical. The process involves loading the quartz reactor with 75 to 100 silicon wafers; evacuating the system; letting the wafers come to a desired temperature at which the deposition will be carried out. The energy required for this reaction can be supplied by simple resistive heating. However, simple, resistive heating is advantageous because the equipment is less expensive, and one avoids radiative film damage often associated with plasma reactors.

The films are characterized by infrared spectroscopy and refractive index. FT-IR spectrum is consistent with thermally grown silicon dioxide and silicon dioxide films deposited from other known oxide precursors e.g. dichlorosilane +$N_2O$, tetraethoxysilane, and diethylsilane. There are strong Si—O—Si asymmetric stretch bands near 1050 $cm^{-1}$ and a weaker Si—O—Si symmetric stretch near 810 $cm^{-1}$. Refractive indices for these films were measured by ellipsometry at 632.4 nm and the refractive indices ranged from 1.46 to 1.50 for these films. There are no bands associated with carbon. FIG. 1 shows the temperature dependence of the silicon oxide deposition rate. BTBAS was flowed at a rate of 55 standard cubic centimeters per minute (sccm) and oxygen was flowed at 90 and 120 sccm. There were no significant differences in film deposition rates, refractive indices, or absorption bands associated with different oxygen flows. This shows that the process is very robust (unchanged by slight changes in variables).

EXAMPLE 2

Figure 2:
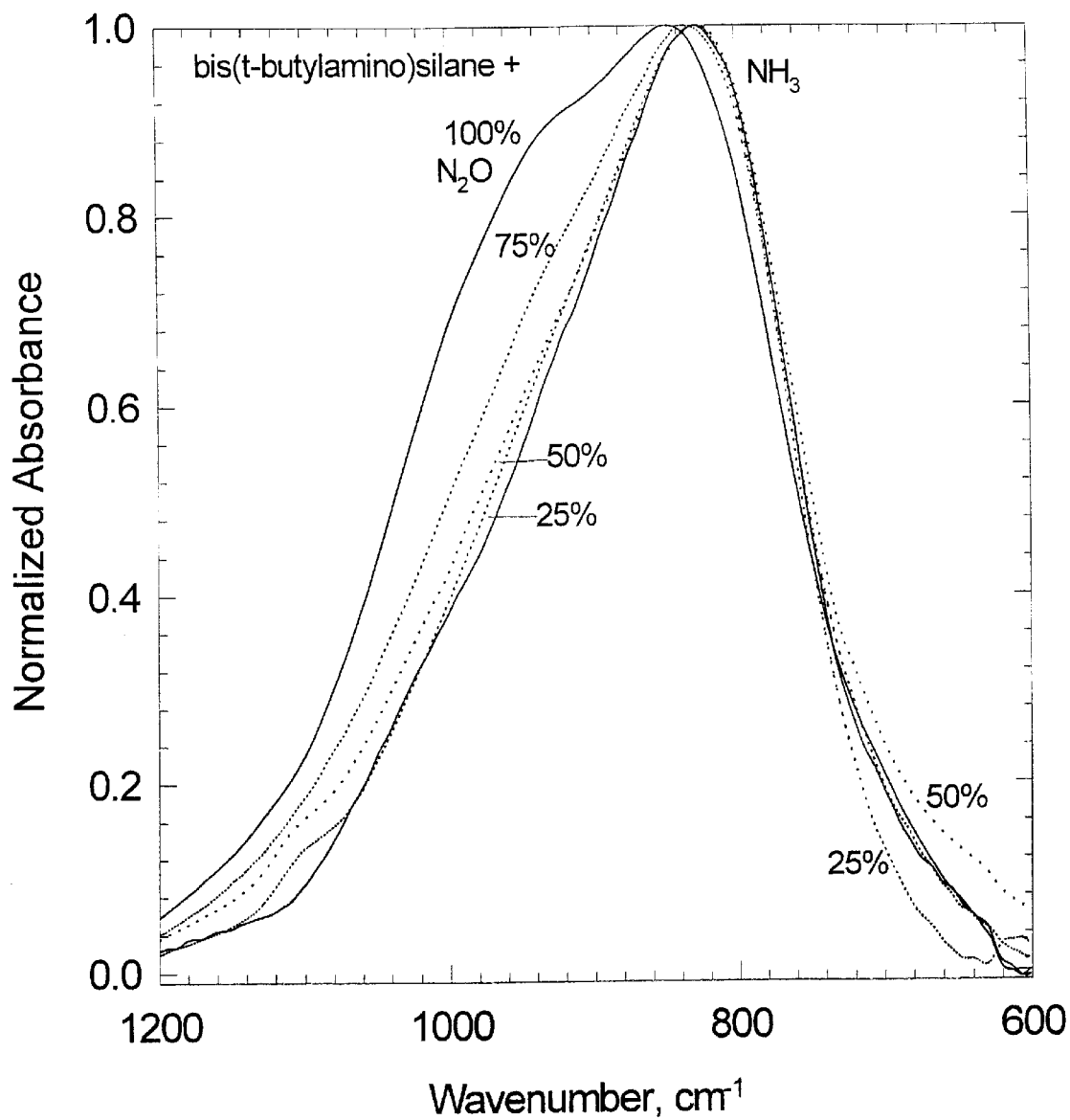
FIG. 2 is a FTIR spectra of silicon oxynitrides showing the effect of changing the ratio $N_2O$ to $NH_3$.

The process involves reaction of bis(tertiarybutylamino)silane with $N_2O$ and $NH_3$ at 600° C. and 500 mTorr reactor pressure. The precursor and reactants are introduced into the heated reactor, as in Example 1. Using 60 sccm BTBAS with varying amounts of $N_2O$ and $NH_3$, the film properties could be varied from a silicon nitride to various silicon oxynitrides. This is shown in the FTIR spectra normalized in FIG. 2. Here the percentages are of $N_2O$ in the mixture of $N_2O$+$NH_3$ (total volumetric flow of 200 sccm). The average deposition rate varied from 20 to 29 Angstroms per minute, with higher rates occuring with higher percentages of $N_2O$.

Figure 3:
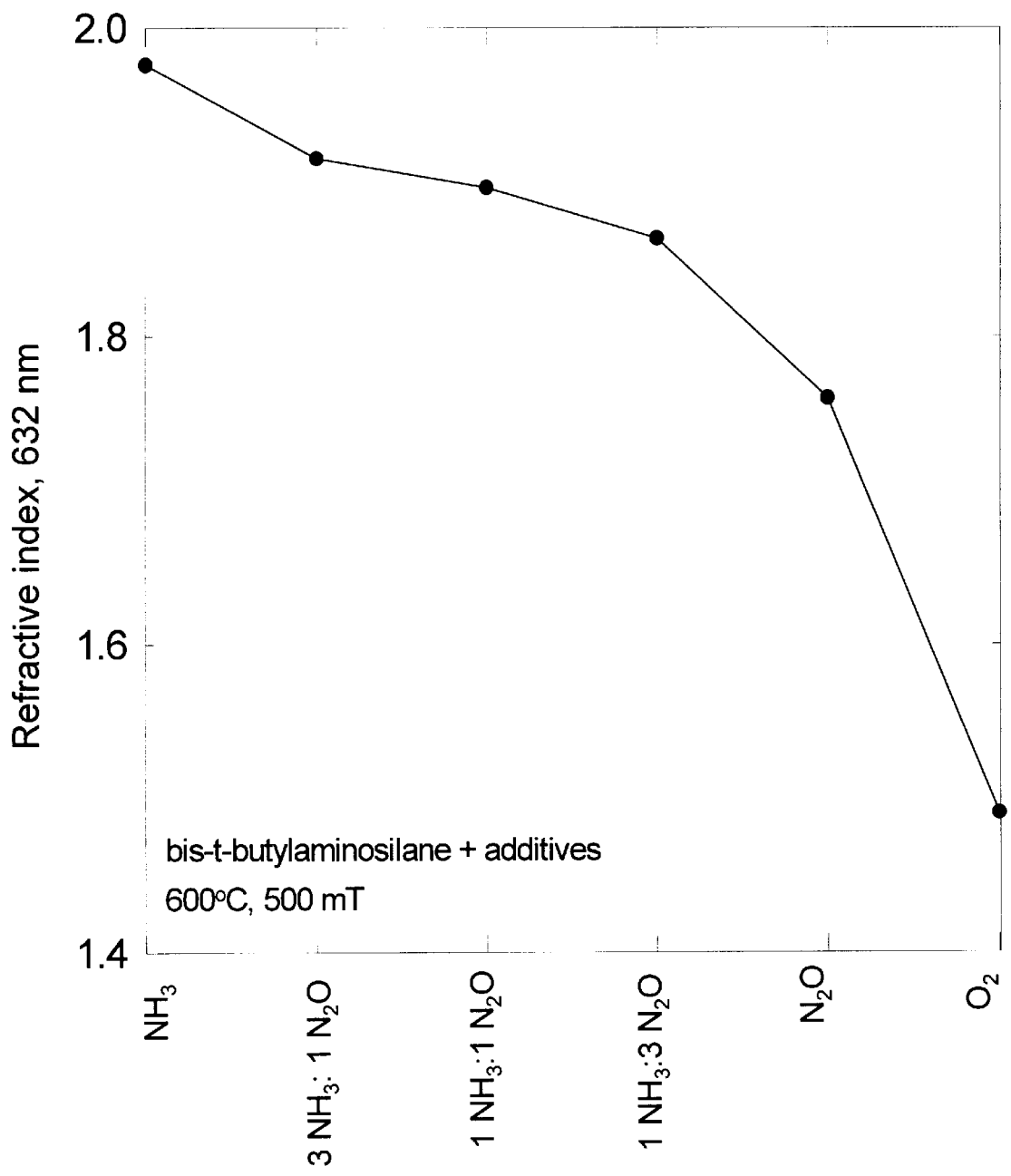
FIG. 3 is a graph of the change in refractive index as a function of the reactant gases $NH_3$ and $N_2O$, as well as $O_2$.

In FIG. 3, the full effect of changing the reactants is displayed. The temperature and pressure were maintained at 600° C. and 500 mTorr for these depositions. The film refractive index then changed from near 2.0 (silicon nitride) to 1.46 (silicon oxide). This shows that a dielectric stack of oxides, nitrides, and oxynitrides may be deposited in a single reactor at a fixed temperature and pressure.

Bis(tertiarybutylamino)silane has been shown to have superior properties and performance in depositing either silicon oxide or silicon oxynitride, as well as silicon nitride. High deposition rates are obtained using chemicals that have N—H bonds; i.e., bis(tertiarybutylamino)silane. The lowest carbon impurities in deposited films are obtained using chemicals that do not have direct Si—C bonds, namely; bis(tertiarybutylamino)silane. The most uniform depositions are obtained using chemicals that have t-butyl groups, namely; bis(tertiarybutylamino)silane. In light of this criteria, bis(tertiarybutylamino)silane is unexpectedly a superior silicon oxide and silicon oxynitride precursor, as well as a silicon nitride precursor.

The present invention has been described with regard to a preferred embodiment, however the full scope of the present invention should be ascertained from the claims which follow.

We claim:

1. A process for the deposition on a substrate of a film of an oxygen containing silicon compound selected from the group consisting of silicon dioxide and silicon oxynitride by reacting bis(tertiarybutylamino)silane at an elevated temperature with a reactant gas selected from the group consisting of oxygen, ozone and mixtures thereof when said silicon compound is silicon dioxide or selected from the group consisting of a nitrogen oxide, ammonia and mixtures thereof when said silicon compound is silicon oxynitride.

2. The process of claim 1 wherein the temperature of the substrate is in the range of approximately 500 to 800° C.

3. The process of claim 1 wherein the pressure is in the range of approximately 20 mTorr to 1 atmosphere.

4. The process of claim 1 wherein the molar ratio of reactant gases to silane is greater than approximately 1:1.

5. The process of claim 1 wherein the substrate is silicon.

6. The process of claim 1 wherein the substrate is an electronic device.

7. The process of claim 1 wherein the substrate is a flat panel display.

8. A process for the chemical vapor deposition on a substrate of silicon dioxide in a reaction zone, comprising the steps of:
   a) heating said substrate to a temperature in the range of approximately 500–800° C. in said zone;
   b) maintaining the substrate at a pressure in the range of approximately 20 mTorr-1 atmosphere in said zone;
   c) introducing into said zone a reactant gas of $O_2$ and a silane of the formula: $(t-C_4H_9NH)_2SiH_2$ and reacting said reactant gas with said silane; and
   d) maintaining the conditions of a) through c) sufficient to cause a film of silicon dioxide to deposit on the substrate.

9. A process for the chemical vapor deposition on a substrate of silicon oxynitride in a reaction zone, comprising the steps of:
   a) heating said substrate to a temperature in the range of approximately 500–800° C. in said zone;
   b) maintaining the substrate at a pressure in the range of approximately 20 mTorr–1 atmosphere in said zone;
   c) introducing into said zone reactant gases selected from the group consisting of $N_2O$, NO, $NO_2$, and mixtures thereof, ammonia and a silane of the formula: $(t-C_4H_9NH)_2SiH_2$ and reacting said reactant gases with said silane; and
   d) maintaining the conditions of a) through c) sufficient to cause a film of silicon oxynitride to deposit on the substrate.

* * * * *